(12) United States Patent
Lin

(10) Patent No.: US 7,051,790 B2
(45) Date of Patent: May 30, 2006

(54) PROTECT COVER FOR A RADIATOR

(75) Inventor: Fang-Cheng Lin, Jhonghe (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 132 days.

(21) Appl. No.: 10/773,134

(22) Filed: Feb. 6, 2004

(65) Prior Publication Data

US 2005/0173105 A1 Aug. 11, 2005

(30) Foreign Application Priority Data

Dec. 19, 2003 (TW) ............................... 92222204 U

(51) Int. Cl.
*F28F 7/00* (2006.01)
(52) U.S. Cl. .................... 165/80.2; 165/185; 361/705
(58) Field of Classification Search ................ 165/185; 361/705
See application file for complete search history.

(56) References Cited

U.S. PATENT DOCUMENTS

| | | | | |
|---|---|---|---|---|
| 2,307,028 A | * | 1/1943 | Dahlgren | 220/283 |
| 3,204,436 A | * | 9/1965 | Nemsky | 70/63 |
| 3,407,079 A | * | 10/1968 | Griffith et al. | 426/124 |
| 4,880,116 A | * | 11/1989 | Kos | 206/454 |
| 5,266,118 A | * | 11/1993 | Mitra | 118/726 |
| 6,029,740 A | * | 2/2000 | Lee et al. | 165/76 |
| 6,049,458 A | * | 4/2000 | Lee et al. | 361/705 |
| 2002/0163076 A1 | * | 11/2002 | Tzeng et al. | 257/720 |
| 2004/0164076 A1 | * | 8/2004 | Baker et al. | 220/23.4 |

FOREIGN PATENT DOCUMENTS

| EP | 0264768 A2 | * | 7/1989 |
|---|---|---|---|
| JP | 2004049821 A | * | 2/2004 |

* cited by examiner

*Primary Examiner*—Allen J. Flanigan

(57) ABSTRACT

A protect cover for a radiator is utilized to protect thermal grease coated at the bottom of the radiator. The protect cover has a cover body with a bottom and lateral sides. Further, the cover body has a support unit projecting from the inner side of the bottom and enclosing a space accommodating the thermal grease so as to prevent the thermal grease from being accidentally touched with foreign substance or being stained with dust during the radiator being delivered or packed.

1 Claim, 3 Drawing Sheets

PROTECT COVER FOR A RADIATOR

BACKGROUND OF THE INVENTION

1. Field of the Invention

The present invention is related to a protect cover of a radiator and particularly to a protect cover, which is detachably attached to the bottom of a radiator to hide and protect heat transfer medium from being stained with dirt and foreign substance during delivery and packing.

2. Brief Description of Related Art

Due to progress of technology, application of the computer brings a great deal of convenience to us so that the computer has become indispensable in our daily lives. However, various electrical components in the computer will generate heat while the computer is in use. Especially, the central processing unit (CPU), which processes mathematic operation, is a component producing heat seriously in case of speed of operation being increased. The conventional way for cooing the CPU is that a radiator with cooling fins is adopted and the bottom thereof is attached to the surface of the chip on the CPU for the heat generated from the chip being able to be dissipated to the open air via surfaces of the cooling fins of the radiator. Besides, in order to enhance effect of heat dissipation, a fan is provided at the cooling device for dissipating the heat speedily.

However, the preceding conventional way is involved in a problem of a clearance, which is formed between the bottom surface of the radiator and the CPU surface due to manufacturing process, increases heat transfer impedance at the two surfaces and results in unfavorable cooling effect. In order to improve the deficiency, a heat transfer medium has been developed to be disposed between the bottom surface of the radiator and the surface of the CPU for blocking the clearance and eliminating the heat transfer impedance of air so as to enhance the effect of heat dissipation.

There are two kinds of heat transfer media available, thermal tape and thermal grease. The thermal tape is further divided into single side type and double type. The single side type thermal tape can be adhered the bottom surface of the radiator once the detachable paper on the thermal tape is torn off and the thermal tape is touched to the chip surface of the CPU directly. The double side type thermal tape at one side thereof can be adhered to the bottom surface of the radiator and at the other side thereof can be adhered to the chip surface of the CPU once the detachable papers at the two sides thereof are torn off. The advantage of utilizing the thermal tape is that the radiator and the CPU can be delivered and packed separately. But, the thermal tape itself is high heat transfer impedance such that a worse effect of beat transfer is provided and it is easy to occur uneven adherence, which is unfavorable for the effect of heat transfer between the radiator and the CPU.

The thermal grease is coated on the bottom surface of the radiator to contact the top of the CPU. The thermal grease has low heat transfer impedance so that a better heat transfer effect can be obtained. However, the thermal grease is sticky in a state of normal temperature and it is easy to stain with dirt or foreign substance in case of being improperly placed. In this way, the quality of heat transfer is affected considerably so that the thermal grease is unfavorable for the radiator being delivered and packed. As a result, the thermal grease has to be used only at the time right before the radiator and the CPU being assembled at the work field instead of being treated in advance at the shop such that it is wasteful for the labor hour and it unfavorable for quality of coating the thermal grease.

It can be understood from the preceding description, the thermal tape provides higher heat transfer impedance but worse effect of heat transfer and the thermal grease provides lower heat transfer impedance with better effect of heat transfer but it is inconvenient for delivering and packing the radiator and the CPU once the thermal grease is coated on the radiator or the CPU. Therefore, how to improve the deficiency of the thermal tape and the thermal grease is a subject has to be cared about.

SUMMARY OF THE INVENTION

An object of the present invention is to provide a protect cover for a radiator for protecting the thermal grease attached at the bottom of the radiator from being accidentally touched or stained with dust.

Another object of the present invention is to provide a protect cover for a radiator with the thermal grease attached to the bottom thereof with which the radiator with the thermal grease is delivered and packed conveniently.

In order to achieve the foregoing objects, the protect cover for a radiator according to the present invention has a cover body with a bottom and a periphery to define a space corresponding to the thermal grease coated at the bottom of the radiator. Further, the cover body has a support unit projecting from the inner side of the bottom thereof for spacing the thermal grease from the bottom of the cover body and preventing the thermal grease from being accidentally touched and being stained with dust.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE PREFERRED EMBODIMENT

Figure 1:
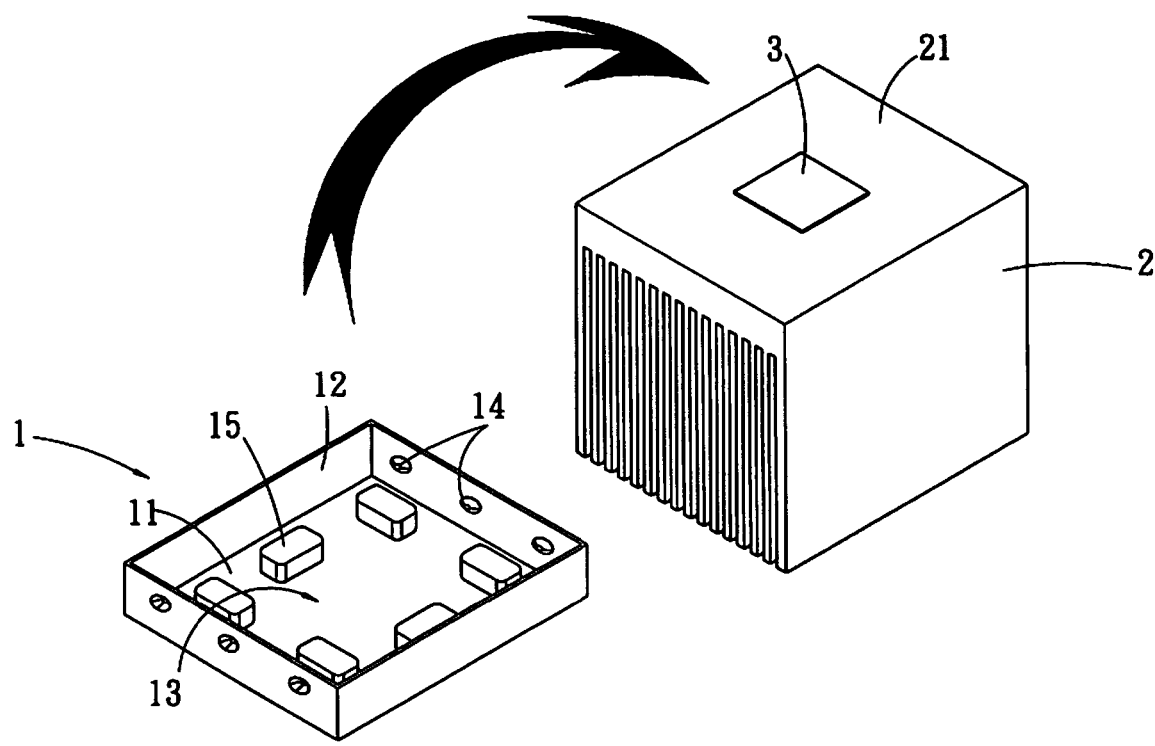
FIG. 1 is a disassembled perspective view of a protect cover for a radiator according to the present invention.
Figure 2:
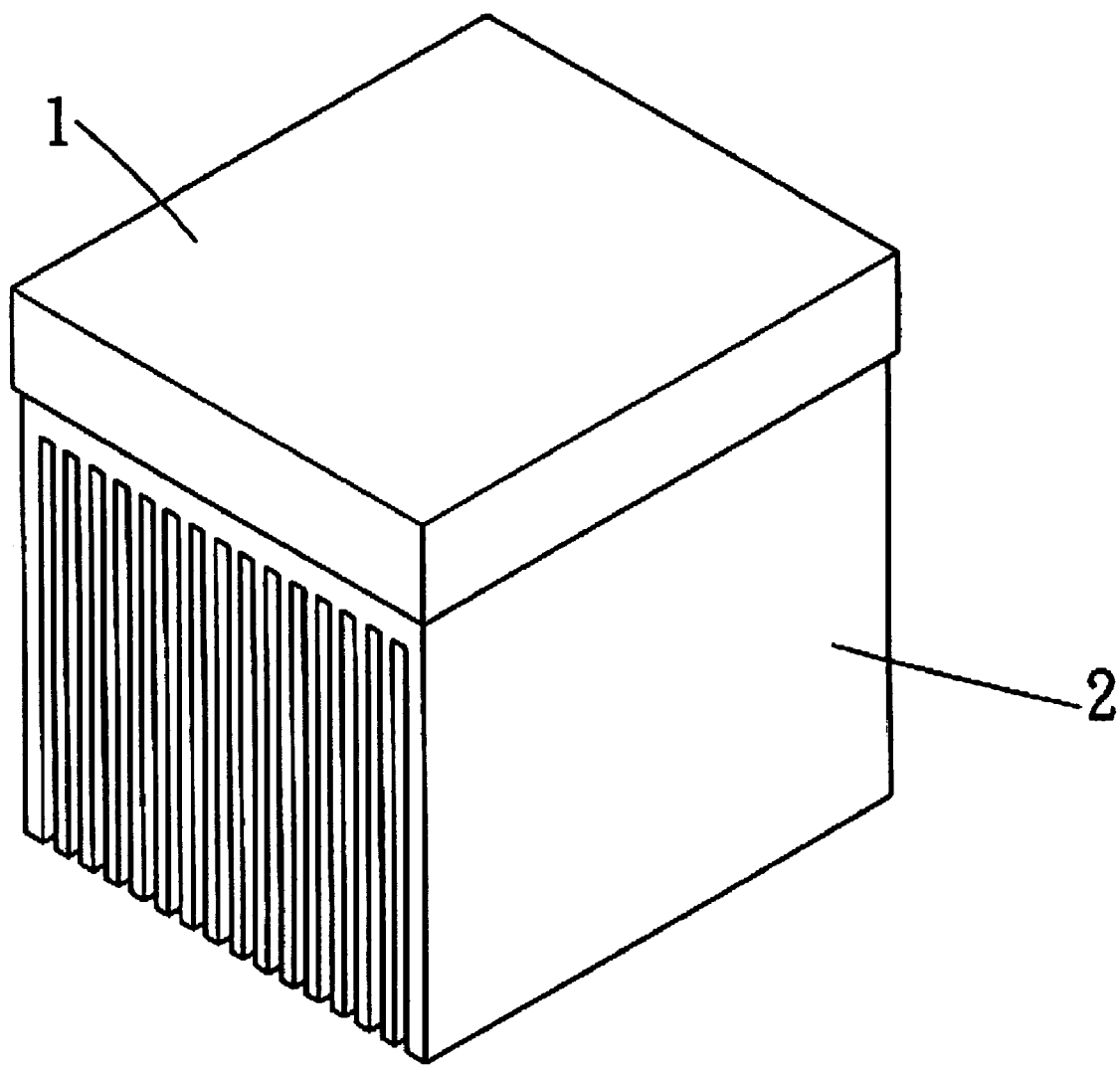
FIG. 2 is a perspective view of the protect cover shown in FIG. 1.
Figure 3:
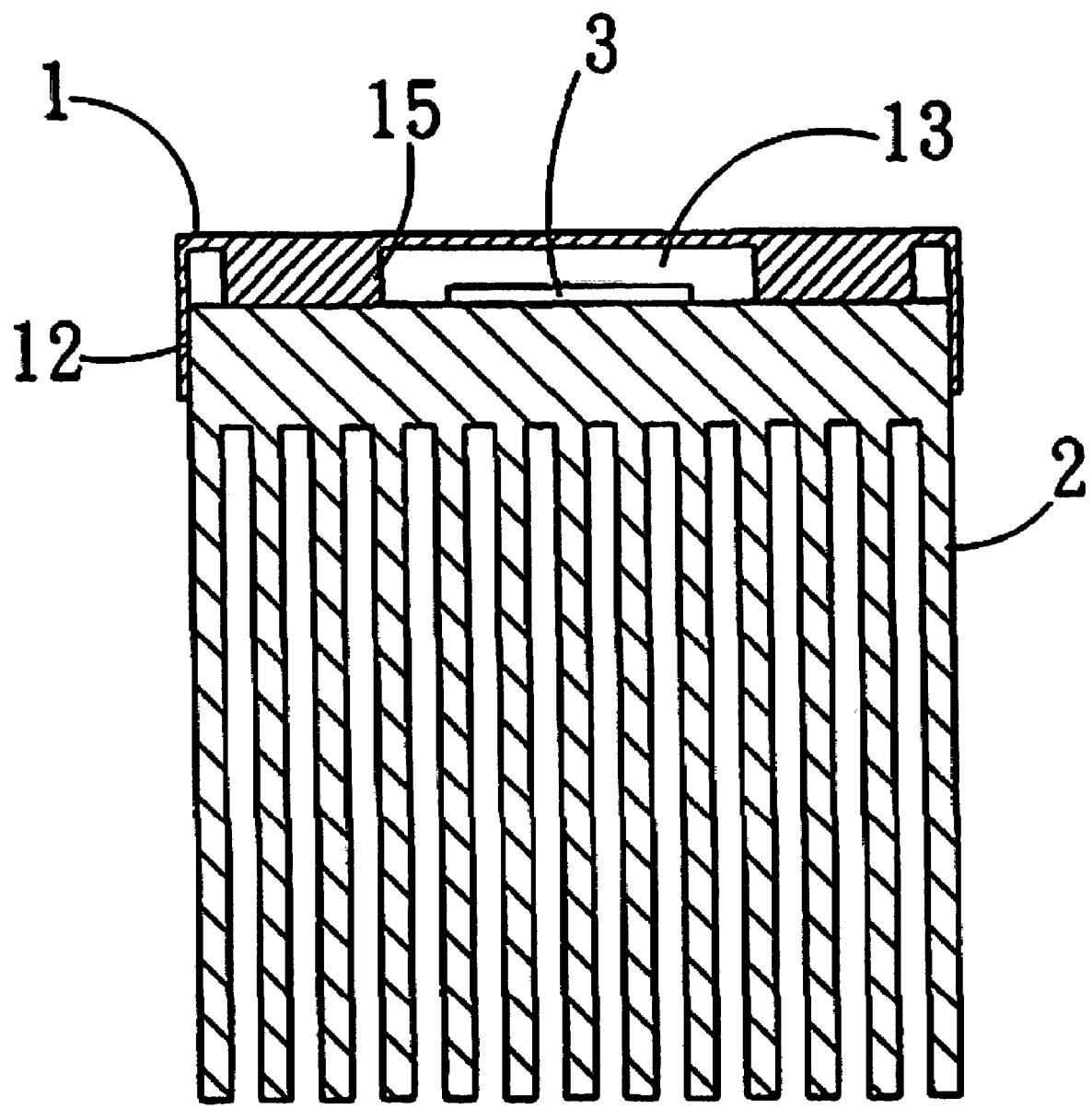
FIG. 3 is a sectional view of FIG. 2.

Referring to FIGS. 1 and 2, a preferred embodiment of a protect cover for a radiator according to the present invention is illustrated. The protect cover is used for covering the bottom 21 of the radiator 2 so as to protect the thermal grease 3 coated on the surface of the bottom 21. The protect cover has a cover body 1, which is composed of a bottom part 11 and four lateral walls 12 corresponding to four lateral sides of the radiator 2, for covering the bottom 21. The lateral walls 12 are provided with an elastic engaging part 14 respectively so that the lateral walls 12 can be fixedly attached to the lateral sides of the radiator 2. Further, the cover body 1 has a support unit 15 at the inner side of the bottom part 11 thereof and the support unit 15 is composed of a plurality of blocking pieces surrounding the inner side of the bottom part 11 and enclosing an area corresponding to the thermal grease 3 on the bottom 21 of the radiator 2.

The thermal grease, is evenly coated on the inner side of the bottom 21 of the radiator 2 at the spot contacting with the CPU by way of screen printing or painting. Once the protect cover of present invention is attached to the bottom 21 of the radiator 2, the cover body 1 covers the thermal grease 3 and allows the thermal grease 3 being disposed in a protect space 13 enclosed by the support unit 15. In this way, the radiator 2 can be delivered and packed easily without worrying about if the thermal grease 3 is stained with dirt or accidentally touched with the foreign substance.

It is appreciated that the protect cover for a radiator according to the present invention is capable of solving the problem of delivering and packing the radiator resulting from the thermal grease being coated on the bottom of the radiator at the spot contacting the CPU for eliminating clearance between the bottom of the radiator and the CPU.

While the invention has been described with referencing to a preferred embodiment thereof, it is to be understood that modifications or variations may be easily made without departing from the spirit of this invention, which is defined by the appended claims.

The invention claimed is:

1. A protective cover attached to a radiator, which radiator is coated with thermal grease at a specific spot on the bottom thereof corresponding to a chip of a central processing unit, comprising:

a cover body with a bottom part and a periphery wall part, having a shape corresponding to the bottom of the radiator;

a support unit, providing a plurality of support block pieces attached to the inner side of the bottom part of the cover body and the support block pieces being disposed to surround an area corresponding to the thermal grease on the bottom of the radiator;

and a plurality of elastic engaging parts, being attached to the inner side of the periphery wall part of the cover body;

wherein, the elastic engaging parts detachably press against the periphery of the radiator and the support unit contacts the bottom of the radiator to space the bottom part of the cover body from the bottom of the radiator.

\* \* \* \* \*